United States Patent
Murakami (10) Patent No.: US 8,103,991 B2
(45) Date of Patent: Jan. 24, 2012

(54) SEMICONDUCTOR INTEGRATED CIRCUIT DESIGNING METHOD, SEMICONDUCTOR INTEGRATED CIRCUIT DESIGNING APPARATUS, AND RECORDING MEDIUM STORING SEMICONDUCTOR INTEGRATED CIRCUIT DESIGNING SOFTWARE

(75) Inventor: Hideaki Murakami, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 925 days.

(21) Appl. No.: 12/105,572

(22) Filed: Apr. 18, 2008

(65) Prior Publication Data

US 2008/0270956 A1 Oct. 30, 2008

(30) Foreign Application Priority Data

Apr. 20, 2007 (JP) .................................. 2007-111541

(51) Int. Cl.
*G06F 17/50* (2006.01)
(52) U.S. Cl. ........................................................ 716/100
(58) Field of Classification Search .................... 716/100
See application file for complete search history.

(56) References Cited

U.S. PATENT DOCUMENTS

| | | | |
|---|---|---|---|
| 7,325,224 B2* | 1/2008 | Seltmann et al. | 716/51 |
| 7,568,180 B2* | 7/2009 | Eisenmann et al. | 716/56 |
| 2005/0004774 A1* | 1/2005 | Volk et al. | 702/108 |
| 2005/0120328 A1* | 6/2005 | Seltmann et al. | 716/21 |
| 2006/0228041 A1* | 10/2006 | Joshi | 382/260 |
| 2008/0081385 A1* | 4/2008 | Marella et al. | 438/14 |
| 2008/0295061 A1* | 11/2008 | Eisenmann et al. | 716/21 |

FOREIGN PATENT DOCUMENTS

| | | |
|---|---|---|
| JP | 2000-241984 | 9/2000 |
| JP | 2005-308944 | 11/2005 |

* cited by examiner

*Primary Examiner* — Suchin Parihar
(74) *Attorney, Agent, or Firm* — Turocy & Watson, LLP (57) ABSTRACT

According to the present invention, there is provided a method for designing a circuit, having, generating electrical filter graphic data indicating a candidate portion where a dimensional value of a layout pattern is permitted to deviate from a design value by taking account of an electrical characteristic, and electrical filter data indicating the permissible dimensional value in the candidate portion of the layout pattern by taking account of the electrical characteristic, by using circuit diagram data, a static timing analytical result, and a result of a circuit simulation, and store them in the storage unit, generating design data by using the electrical filter graphic data, and form a layout pattern by using the design data, detecting a lithography error by performing a lithography simulation on the layout pattern, determining by using the electrical filter database whether the error requires correction by taking account of the electrical characteristic, correcting the layout if the error is found to require the correction, and outputting a result of the correction of the layout.

20 Claims, 12 Drawing Sheets

| LAYER NUMBER | ELECTRICAL CHARACTERISTIC CLASSIFICATION | DATA TYPE | DIFFERENCE FROM DESIGN VALUE (nm) | DELAY TIME (psec) |
|---|---|---|---|---|
| 1 | SETUP MARGIN | 1 | 1 | 1 |
| 1 | SETUP MARGIN | 2 | 2 | 2 |
| 1 | SETUP MARGIN | 3 | 3 | 3 |
| 1 | SETUP MARGIN | 4 | 5 | 4 |
| 1 | SETUP MARGIN | 5 | 10 | 6 |
| 1 | SETUP MARGIN | 6 | 20 | 10 |

| LAYER NUMBER | ELECTRICAL CHARACTERISTIC CLASSIFICATION | DATA TYPE | DIFFERENCE IN L BETWEEN LEFT AND RIGHT TRANSISTORS (nm) | OPERATION ERROR |
|---|---|---|---|---|
| 2 | CURRENT MIRROR SYMMETRY | 1 | 1 | PRESENT/ABSENT |
| 2 | CURRENT MIRROR SYMMETRY | 2 | 2 | PRESENT/ABSENT |
| 2 | CURRENT MIRROR SYMMETRY | 3 | 3 | PRESENT/ABSENT |
| 2 | CURRENT MIRROR SYMMETRY | 4 | 4 | PRESENT/ABSENT |
| 2 | CURRENT MIRROR SYMMETRY | 5 | 5 | PRESENT/ABSENT |
| 2 | CURRENT MIRROR SYMMETRY | 6 | 6 | PRESENT/ABSENT |

FIG. 8

| LAYER NUMBER | ELECTRICAL CHARACTERISTIC CLASSIFICATION | DATA TYPE | GATE LENGTH L OF TRANSISTOR (nm) |
|---|---|---|---|
| 3 | CURRENT MIRROR UPPER LIMIT | 1 | 120 |
| 3 | CURRENT MIRROR LOWER LIMIT | 2 | 75 |

| LAYER NUMBER | ELECTRICAL CHARACTERISTIC CLASSIFICATION | DATA TYPE | DIFFERENCE BETWEEN WIDTHS OF TWO LINES (nm) | OPERATION ERROR |
|---|---|---|---|---|
| 4 | RESISTANCE RATIO | 1 | 1 | PRESENT/ ABSENT |
| 4 | RESISTANCE RATIO | 2 | 2 | PRESENT/ ABSENT |
| 4 | RESISTANCE RATIO | 3 | 3 | PRESENT/ ABSENT |
| 4 | RESISTANCE RATIO | 4 | 4 | PRESENT/ ABSENT |
| 4 | RESISTANCE RATIO | 5 | 5 | PRESENT/ ABSENT |
| 4 | RESISTANCE RATIO | 6 | 6 | PRESENT/ ABSENT |

FIG. 12

| LAYER NUMBER | ELECTRICAL CHARACTERISTIC CLASSIFICATION | DATA TYPE | LINE WIDTH (nm) |
|---|---|---|---|
| 5 | LINE WIDTH UPPER LIMIT | 1 | 70 |
| 5 | LINE WIDTH LOWER LIMIT | 2 | 50 |

| LAYER NUMBER | ELECTRICAL CHARACTERISTIC CLASSIFICATION | DATA TYPE | DIFFERENCE FROM DESIGN VALUE (nm) | LEAKAGE CURRENT VALUE ($\mu$A) |
|---|---|---|---|---|
| 6 | DYNAMIC FOOT PATH | 1 | 1 | 2 |
| 6 | DYNAMIC FOOT PATH | 2 | 2 | 4 |
| 6 | DYNAMIC FOOT PATH | 3 | 3 | 6 |
| 6 | DYNAMIC FOOT PATH | 4 | 4 | 8 |
| 6 | DYNAMIC FOOT PATH | 5 | 5 | 11 |
| 6 | DYNAMIC FOOT PATH | 6 | 6 | 14 |

SEMICONDUCTOR INTEGRATED CIRCUIT DESIGNING METHOD, SEMICONDUCTOR INTEGRATED CIRCUIT DESIGNING APPARATUS, AND RECORDING MEDIUM STORING SEMICONDUCTOR INTEGRATED CIRCUIT DESIGNING SOFTWARE

CROSS REFERENCE TO RELATED APPLICATION

This application is based upon and claims benefit of priority under 35 USC §119 from the Japanese Patent Application No. 2007-111541, filed on Apr. 20, 2007, the entire contents of which are incorporated herein by reference.

BACKGROUND OF THE INVENTION

The present invention relates to a semiconductor integrated circuit designing method, a semiconductor integrated circuit designing apparatus, and a recording medium storing semiconductor integrated circuit designing software and, more particularly, to a method, apparatus, and recording medium for verifying a lithography rule check (to be referred to as an LRC hereinafter) when correcting data during the formation of a mask for fabricating a semiconductor integrated circuit.

Semiconductor integrated circuits capable of containing a huge number of transistors by using the most advanced processes have various layout patterns in order to, e.g., implement functions and reduce chip areas.

To ensure a good yield of lithography in the scene of production, a lithography simulation that changes focusing, the exposure amount, and the like over broad ranges is used to check the possibilities of various layout patterns.

In the conventional MDP (Mask Data Processing)/OPC (Optical Proximity Correction), the implementation of a layout pattern formed by a designer is the final target, and addition, deletion, and the like of fine patterns are performed to approach the design value as close as possible.

In normal semiconductor design, a schematic corresponding to a rough wiring diagram is formed before the formation of a layout pattern, in order to optimize the electrical characteristics and timings.

In the conventional LRC verification, however, the LRC operation is started from a layout diagram formed after this schematic formation without using the information generated by the schematic formation. That is, the operation sequence is constructed and the setting conditions of each tool, error filters, and the like in the operation sequence are adjusted in order to implement the layout pattern formed by the designer.

This operation sequence has steps of outputting design data found to have no error on the basis of a design rule check (to be referred to as a DRC hereinafter), performing the MDP/OPC, performing the LRC, and checking an error.

This conventional sequence is constructed without taking the electrical characteristics into consideration. That is, the MDP/OPC is executed without using any information concerning the electrical characteristics, and the presence/absence of an error of a lithographed layout pattern is checked by the LRC, thereby increasing the verification load of error determination.

More specifically, if an error is detected in the conventional sequence, a lithography engineer alone cannot determine the contents of correction in many cases. As a consequence, the error information is fed back to a designer, the designer corrects the design, and the turn around time (to be referred to as the TAT hereinafter) increases. Alternatively, even when an error is found by the LRC, a portion requiring no layout pattern correction sometimes exists if the information concerning the electrical characteristics is taken into account. If a lithography engineer alone must correct this error, however, he or she corrects even a portion as described above, and the correction load increases.

A reference disclosing the conventional LRC verification technique is as follows.
Japanese Patent Laid-Open No. 2005-308944

SUMMARY OF THE INVENTION

According to one aspect of the present invention, there is provided a method of designing a semiconductor integrated circuit by using a designing apparatus having an arithmetic unit, a storage unit, and an output unit, the method comprising: causing the arithmetic unit to generate electrical filter graphic data indicating a candidate portion where a dimensional value of a layout pattern is permitted to deviate from a design value by taking account of an electrical characteristic, and electrical filter data indicating the permissible dimensional value in the candidate portion of the layout pattern by taking account of the electrical characteristic, by using circuit diagram data, a static timing analytical result obtained by verifying a timing of a circuit operation, and a result of a circuit simulation, and store the electrical filter graphic data and the electrical filter data in the storage unit; causing the arithmetic unit to generate design data by using the electrical filter graphic data, and form a layout pattern by using the design data; causing the arithmetic unit to detect a lithography error by performing a lithography simulation on the layout pattern; causing the arithmetic unit to determine by using the electrical filter database whether the error requires correction by taking account of the electrical characteristic; causing the arithmetic unit to correct the layout if the error is found to require the correction; and causing the output unit to output a result of the correction of the layout.

According to one aspect of the present invention, there is provided a semiconductor integrated circuit designing apparatus comprising: an arithmetic unit configured to generate electrical filter graphic data indicating a candidate portion where a dimensional value of a layout pattern is permitted to deviate from a design value by taking account of an electrical characteristic, and electrical filter data indicating the permissible dimensional value in the candidate portion of the layout pattern by taking account of the electrical characteristic, by using circuit diagram data, a static timing analytical result obtained by verifying a timing of a circuit operation, and a result of a circuit simulation, generate design data by using the electrical filter graphic data, and form a layout pattern by using the design data, detect a lithography error by performing a lithography simulation on the layout pattern, determine by using the electrical filter database whether the error requires correction by taking account of the electrical characteristic, and correct the layout if the error is found to require the correction; an output unit configured to output a result of the correction of the layout; and a storage unit configured to store the electrical filter graphic data and the electrical filter database.

According to one aspect of the present invention, there is provided a computer-readable recording medium storing semiconductor integrated circuit designing software for causing a computer having an arithmetic unit, a storage unit, and an output unit to execute a semiconductor integrated circuit designing method, said software stored in the recording medium comprising: causing said arithmetic unit to generate electrical filter graphic data indicating a candidate portion where a dimensional value of a layout pattern is permitted to deviate from a design value by taking account of an electrical characteristic, and electrical filter data indicating the permissible dimensional value in the candidate portion of the layout pattern by taking account of the electrical characteristic, by using circuit diagram data and a static timing analytical result obtained by verifying a timing of a circuit operation; causing said storage unit to store the electrical filter graphic data and the electrical filter data; causing said arithmetic unit to generate design data by using the electrical filter graphic data, and form a layout pattern by using the design data; causing said arithmetic unit to detect a lithography error by performing a lithography simulation on the layout pattern; causing said arithmetic unit to determine by using the electrical filter database whether the error requires correction by taking account of the electrical characteristic; causing said arithmetic unit to correct the layout if the error is found to require the correction; and causing said output unit to output a result of the correction of the layout.

DETAILED DESCRIPTION OF THE INVENTION

As described previously, if a layout pattern found to have an error by the LRC is detected in the conventional LRC verification sequence, a lithography engineer alone cannot correct the error, so the error information is fed back to a circuit designer. In this case, if the error has occurred between two metal interconnections electrically set at the same potential, the circuit designer need not correct the error in some cases even when the shape may cause a shortcircuit.

That is, the MDP/OPC and LRC are conventionally performed without taking account of the electrical characteristics, the information is unnecessarily fed back to circuit design.

From a 90-nm node, it is very difficult to obtain optimum lithography conditions for all of various layout patterns, and there is no real solution in some cases.

By contrast, the number of errors to be corrected can be reduced in the MDP/OPC and LRC by presetting verification criteria by a circuit designer. An example of the verification criteria is to determine no error between interconnections at the same potential as described above even in a situation close to a shortcircuit.

An embodiment of the present invention will be explained below with reference to the accompanying drawings.

Figure 2:
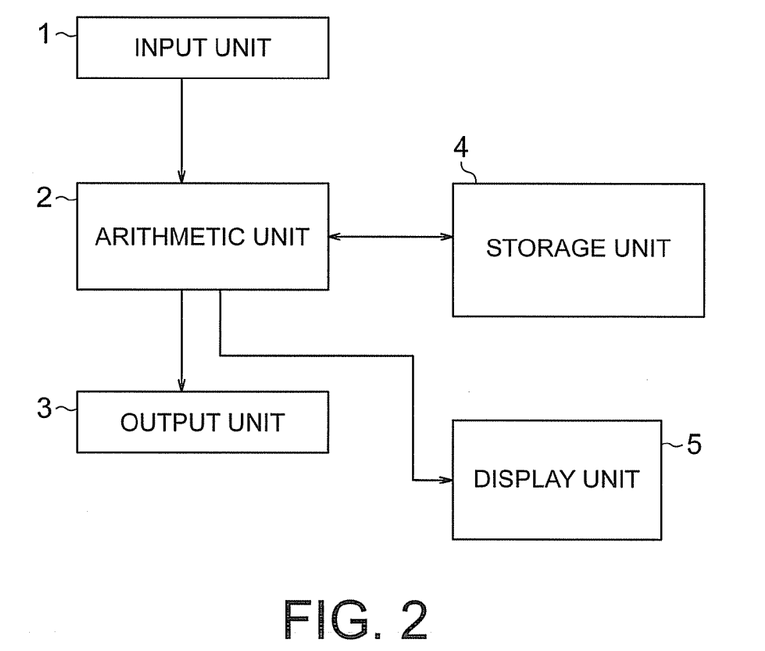
FIG. 2 is a block diagram showing the arrangement of a semiconductor integrated circuit designing apparatus according to the embodiment.

A semiconductor integrated circuit designing method according to the embodiment of the present invention is executed by using a designing apparatus shown in FIG. 2.

FIG. 2 shows an outline of the arrangement of this designing apparatus. The designing apparatus comprises an input unit 1 for inputting various data, an arithmetic unit 2 for performing various arithmetic operations by using input data or data stored in a storage unit 4, a display unit 5 for displaying arithmetic operation results, input data, and the like, and an output unit 3 for outputting arithmetic operation results and the like.

Figure 1:
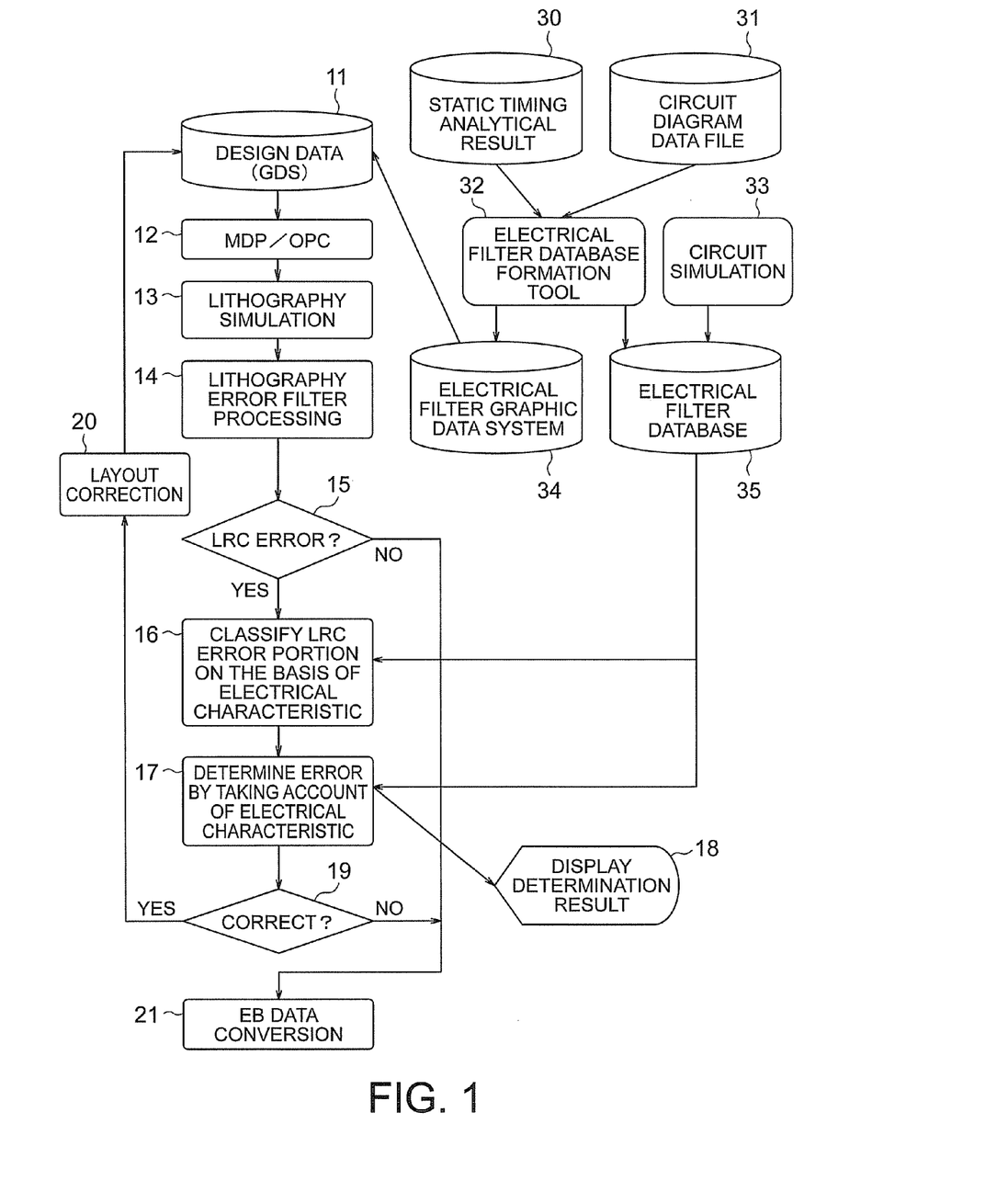
FIG. 1 is a flowchart showing the procedure of processing in a semiconductor integrated circuit designing method according to an embodiment of the present invention.

FIG. 1 shows the procedure of the semiconductor integrated circuit designing method according to the embodiment of the present invention.

A circuit diagram data file 31 and static timing analytical result 30 are data used in an automation process performed by software when designing an integrated circuit. The circuit diagram data file 31 is circuit diagram data corresponding to a rough routing diagram. Of items (a) to (d) of electrical characteristics to be taken into consideration (to be described later), pieces of information concerning (b), (c), and (d) are held as they are embedded in a circuit diagram by a circuit designer.

The static timing analytical result 30 is a data file formed with respect to layout pattern data by using various EDA (Electrical Design Analysis) tools such as a static timing analysis (to be referred to as STA hereinafter) tool for verifying the timing of a circuit operation. The static timing analytical result 30 contains information pertaining to item (a) of the electrical characteristics to be taken into consideration (to be described later).

The arithmetic unit 2 receives the circuit diagram data file 31 and static timing analytical result 30 as described above, and generates the following database by using an electrical file database formation tool 32.

Figure 4A:
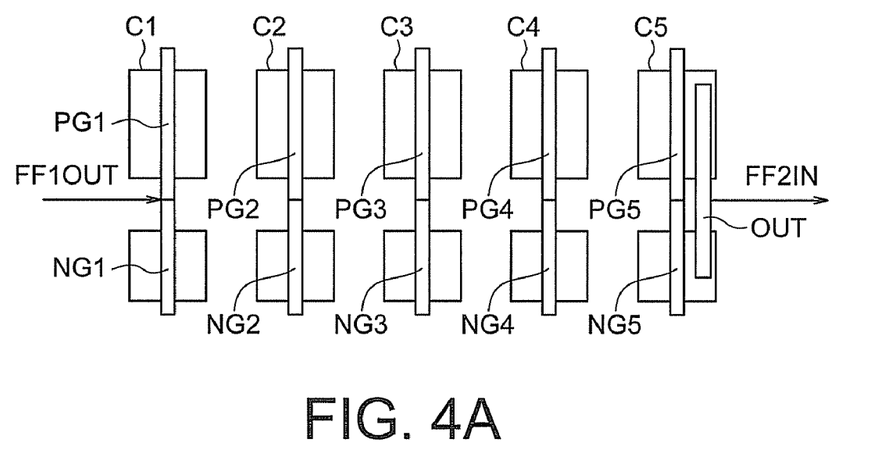
FIGS. 4A and 4B are views showing layout patterns before and after the electrical characteristics are taken into consideration in the first example.
Figure 4B:
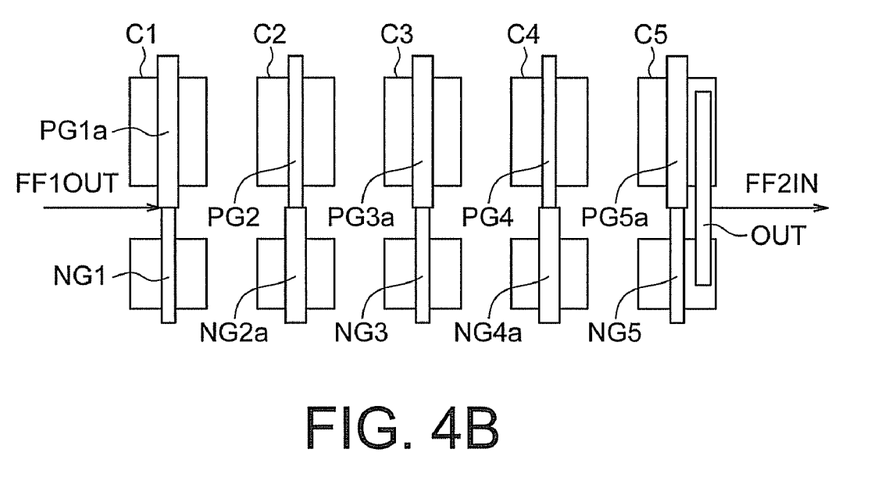

First, the electrical file database formation tool 32 uses the circuit diagram data file 31 to generate a database concerning GDS-formatted graphic information called an electrical filter graphic data system (to be referred to as a GDS hereinafter) 34 to which information for verifying and taking account of electrical characteristics is added. More specifically, as will be described later with reference to FIG. 4, the electrical filter GDS 34 is data showing, on a diagram, a candidate portion that is allowed deviate to some extent from a design value by noting a specific pattern dimension.

Also, the electrical filter database formation tool 32 generates the electrical filter GDS 34 by using the static timing analytical result 30.

In addition, a circuit simulation 33 is performed, and the electrical filter database formation tool 32 given the static timing analytical result 30 generates an electrical filter database 35.

As described above, the electrical filter GDS 34 shows a candidate portion that can deviate from a design value on a diagram. The electrical filter database 35 is data showing a plurality of practical numerical values showing deviations from a design value, and showing, for each numerical value, the presence/absence of a circuit operation, such as a leakage current value or operation error, occurring when the difference is produced. The electrical filter database 35 is used in error determination. Practical numerical values indicating deviations from a design value in the electrical filter database 35 will be described later.

The arithmetic unit 2 uses the electrical filter database 35 in step 16 (to be described later), and classifies a portion found to have an error on lithography into a category pertaining to the electrical characteristics. Also, in step 17, error determination is performed by taking account of the electrical characteristics.

In step 11, taped-out design data found to have no error by the DRC is input to the input unit 1. The information of the data file called the electrical filter GDS 34 described above is added to this design data to generate design data 11, and the design data 11 is stored in the storage unit 4. That is, the information indicating, on a diagram, a portion that is allowed to deviate to some extent from a circuit design value is added to the design data 11.

In step 12, the arithmetic unit 2 performs the MDP and OPC on the design data 11.

In step 13, the arithmetic unit 2 performs a lithography simulation on the design data 11 having undergone the MDP and OPC, thereby performing the LRC.

In step 14, the arithmetic unit 2 performs lithography error filter processing for determining whether there is a lithography error, thereby detecting the presence/absence of a lithography error.

In step 15, the process branches to step 16 or 21 in accordance with the presence/absence of a lithography error detected by the arithmetic unit 2. If there is no error, the process advances to step 21 to perform electrical beam (to be referred to as EB hereinafter) data conversion for forming a mask for EB exposure.

If a lithography error is found, the process advances to step 16. The arithmetic unit 2 classifies the lithography error into a category of the electrical characteristics by using the electrical filter database 35.

In step 17, the arithmetic unit 2 determines whether the portion found to have a lithography error and classified on the basis of the electrical characteristic is an error requiring correction or an error requiring no correction by taking account of the electrical characteristic. In step 18, the display unit 5 displays the determination result.

The display contents on the display unit 5 are as follows. In addition to terms "open", "short", and "whole coverage" normally used to display errors, various errors unpermissible from the viewpoint of the electrical characteristics are displayed. For example, if unpermissible asymmetry occurs in a portion to be kept symmetrical in, e.g., a sense amplifier or current mirror circuit (to be described later), "asymmetrical error" is formed as an error category and an operator is notified of it.

In step 19, the process branches to step 20 for an error portion requiring correction, and to step 21 for an error portion requiring no correction. In step 20, the error portion requiring correction is fed back to the layout engineer, and the layout pattern is corrected. In step 21, the error portion requiring no correction is converted into EB data for mask formation.

Examples of the information stored in the form of a table in the electrical filter database 35 and concerning the electrical characteristics to be taken into consideration in step 16 will be explained below. Taking account of these pieces of information in the error verification filter reduces the load of the feedback loop from step 19 to step 20.

a) Control information of setup, i.e., the critical dimension value (to be referred to as the CD value hereinafter) of the dimension of each element in a combinational circuit existing in a path having a margin for the timing at which a signal arrives at a predetermined node on a circuit b) Control information of the CD value in a portion such as a current mirror circuit to be kept symmetrical in a layout pattern c) Control information of the actual finished values of a portion that poses no problem in a circuit operation even when a shortcircuit occurs because the potential remains the same in the portion, on a layout pattern that can easily shortcircuit d) Control information of the finished value, such as the resistance value, of an element requiring a highly accurate analogue quantity with respect to a layout pattern e) Control information of the CD value that acts to reduce a leakage current in order to prevent an operation error, in a foot device in a dynamic domino circuit This embodiment can shorten the time required for error determination and correction in the LRC by taking these electrical characteristics into consideration, thereby shortening the TAT of the whole processing.

First Example

In steps 16 and 17 of the above embodiment, the presence/absence of the necessity of correction of a layout is determined for a lithography error portion on the basis of the information related to the electrical characteristics and stored in the electrical filter database 35. The first practical example of this determination will be explained below.

In this procedure, the static timing analysis (STA) is first executed to generate the static timing analytical result 30 shown in FIG. 1. A path having an extra setup time, i.e., a timing margin is extracted from the obtained analytical result 30.

In steps 16 and 17, this timing margin is reflected on the error determination criterion taking account of the information pertaining to the electrical characteristics.

Figure 3:
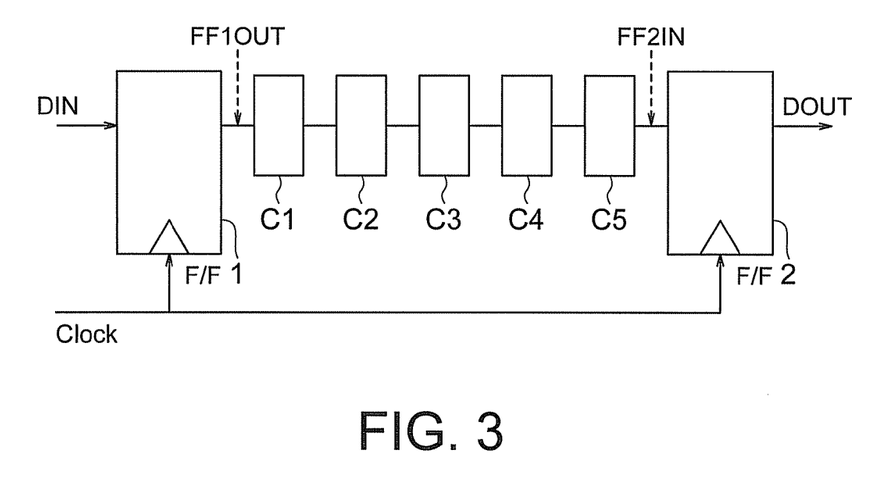
FIG. 3 is a circuit diagram showing the first example taking account of the electrical characteristics in the embodiment.

As an example of the circuit, FIG. 3 shows a configuration in which five combinational circuits C1 to C5 are connected in series between two flip-flops F/F1 and F/F2.

Assume that as the result obtained by the static timing analysis (STA), a setup timing margin of 500 ps exists between the flip-flops F/F1 an F/F2. In this case, one combinational circuit has a margin of 100 ps.

When performing the MDP/OPC in step 12, therefore, this margin is taken into consideration. Consequently, a CD value corresponding to a timing margin of 100 ps is permitted, i.e., a gate width (channel length) W of a transistor can be increased.

As an example of the combinational circuits C1 to C5, FIG. 4A shows a configuration in which five inverters C1 to C5 each including a P-channel MOS transistor and N-channel MOS transistor are connected in series. An output signal FF1OUT from the flip-flop F/F1 in the preceding stage is input to a gate PG1 of the P-channel MOS transistor and a gate NG1 of the N-channel MOS transistor of the first inverter C1. An output signal FF2IN is output from an output terminal OUT connected to the drain of the P-channel MOS transistor and the drain of the N-channel MOS transistor of the fifth inverter C5, and input to the flip-flop F/F2 in the succeeding stage.

When the above-mentioned margin is taken into account, as shown in FIG. 4B, the gate widths W of the P-channel MOS transistors and N-channel MOS transistors of these inverters can be alternately increased. More specifically, it is possible to increase the gate widths W of a gate PG1a of the P-channel MOS transistor of the first inverter C1, a gate NG2a of the N-channel MOS transistor of the second inverter C2, that of a gate PG3a of the P-channel MOS transistor of the third inverter C3, a gate NG4a of the N-channel MOS transistor of the fourth inverter C4, and a gate NG5a of the N-channel MOS transistor of the fifth inverter C5.

Alternatively, it is possible to increase the gate widths W of both the N-channel MOS transistors and P-channel MOS transistors of the inverters C1 to C5. In this case, an overall gate width W must be matched with a smaller setup timing margin in both a path through which the leading edge of a pulse propagates and a path through which the trailing edge of the pulse propagates.

Figure 5A:
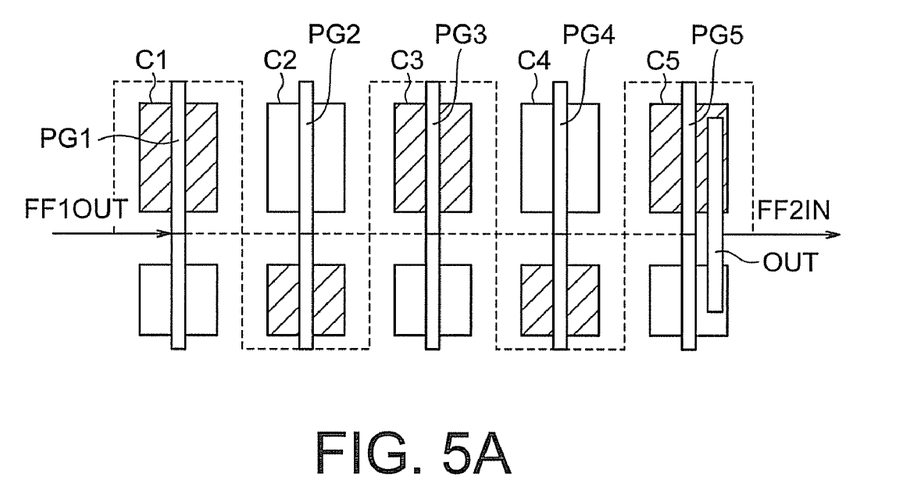
FIGS. 5A and 5B are views showing layout patterns to which information concerning the electrical characteristics is added in the first example.
Figure 5B:
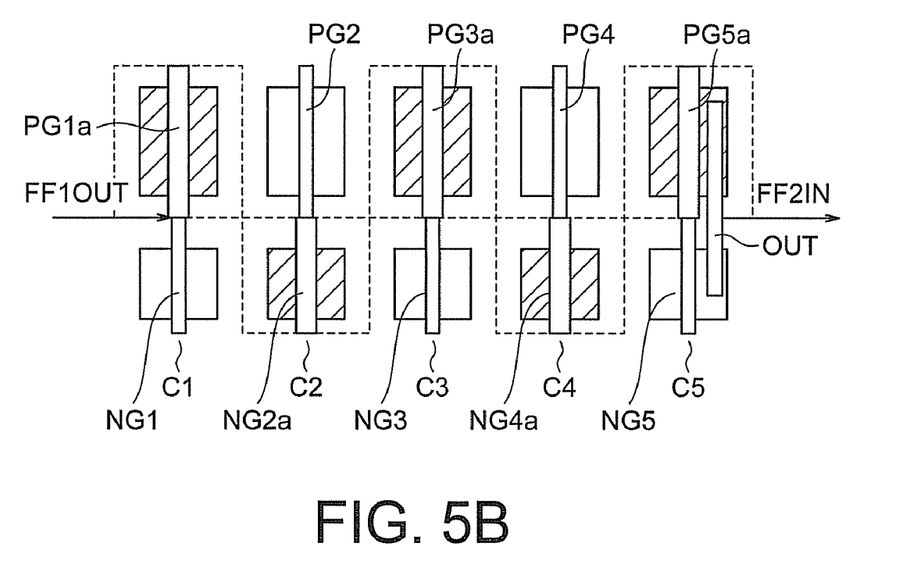

To implement this processing, information as shown in FIG. 5 is formed. Referring to FIG. 5, the gate width W of a transistor surrounded by the dotted lines and having hatched source/drain regions can be increased. Graphic information like this corresponds to the electrical filter graphic data system 34.

Figure 6:
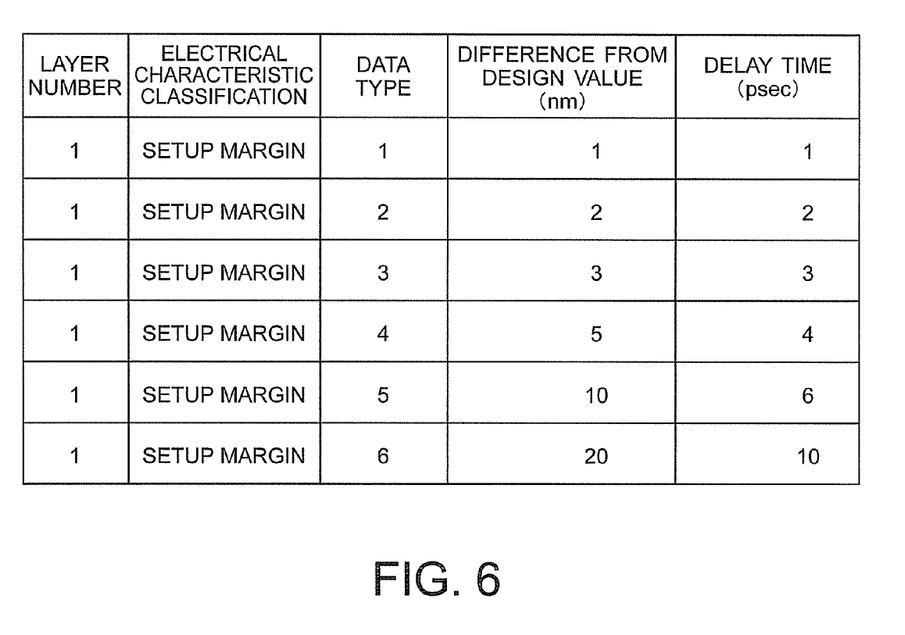
FIG. 6 is a view showing error determination reference values permissible when taking account of the electrical characteristics in the first example.

FIG. 6 shows practical error determination criteria in the form of a table as the first example of the electrical filter database 35. "1" is assigned as the layer number, and the electrical characteristic is classified into a category "setup margin". As data types, six types of data are prepared. 1, 2, 3, 5, 10, and 20 (nm) are respectively set for data types "1", "2", "3", "4", "5", and "6" as deviations (in this example, numerical values indicating an increase in gate length L) from a design value. In addition, 1, 2, 3, 4, 6, and 10 (psec) are set for these data types as the delay times obtained by the STA 30 and corresponding to the deviations from the design value.

That is, when a delay time of 1 (psec) is permissible, the gate width W can increase to 1 (nm). When a delay time of 3 (psec) is permissible, the gate width W can increase to 3 (nm).

Error determination is performed in step 17 of FIG. 1 on the basis of the criteria taking account of the electrical characteristic pertaining to the setup margin as described above.

Second Example

Figure 7:
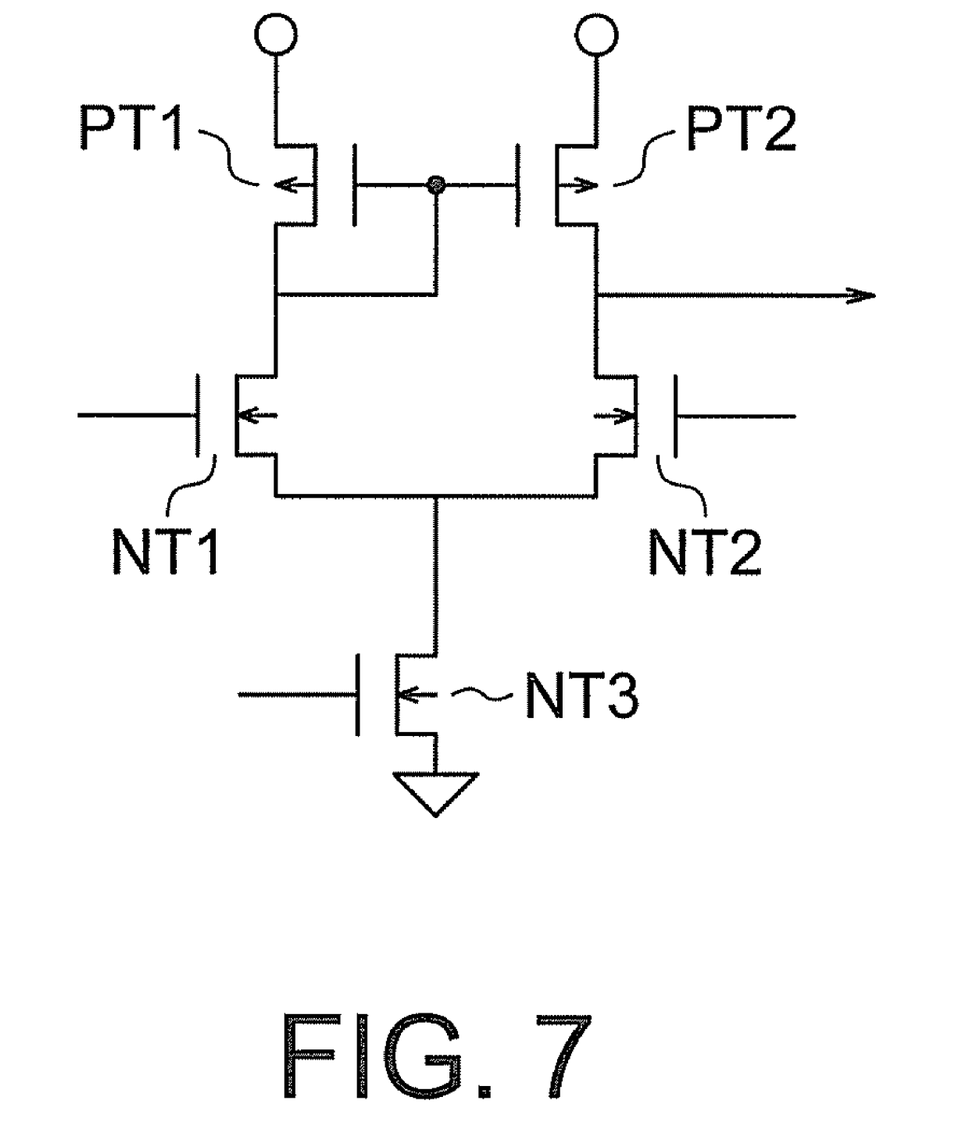
FIG. 7 is a circuit diagram showing the second example taking account of the electrical characteristics in the embodiment.

The second practical example of the information concerning the electrical characteristics to be taken into account in the above embodiment will be explained below. An object of this example is a current mirror circuit as shown in FIG. 7.

This current mirror circuit comprises a pair of P-channel MOS transistors PT1 and PT2, a pair of N-channel MOS transistors NT1 and NT2, and an N-channel MOS transistor NT3. Since the P-channel MOS transistors PT1 and PT2 must be symmetrical and the N-channel MOS transistors NT1 and NT2 must be symmetrical, a layout pattern must be formed to make the characteristics of these transistors identical.

The conventional design data immediately after being taped out contains no information pertaining to such circuit characteristics as above. If the MDP and OPC are performed by using the conventional design data, therefore, the symmetry of the left and right transistors may be lost.

Figure 8:
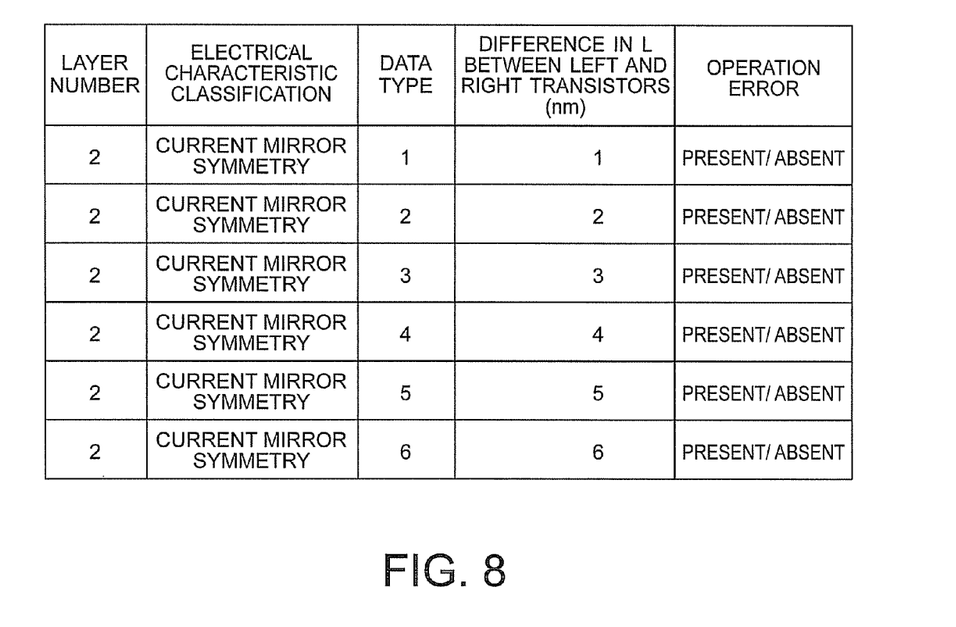
FIG. 8 is a view showing error determination reference values permissible when taking account of the electrical characteristics in the second example.

Accordingly, this embodiment takes account of permissible deviations concerning the transistor symmetry. FIG. 8 shows a practical example of the obtained electrical filter database 35. "2" is assigned as the layer number, the electrical characteristic is classified into a category "current mirror symmetry", and six data types are prepared. Whether an operation error occurs is determined in each of the cases where the differences between the gate lengths L of the left and right transistors, e.g., the P-channel MOS transistors PT1 and PT2 are 1, 2, 3, 4, 5, and 6 (nm). The circuit simulation 33 determines whether an operation error occurs for each difference.

Figure 9:
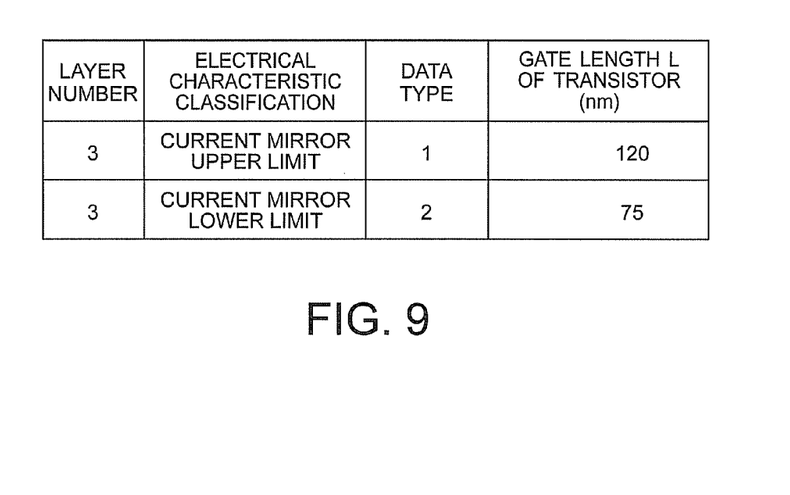
FIG. 9 is a view showing the upper limit and lower limit pertaining to a deviation from a design value when taking account of the electrical characteristics in the second example.

In addition, even when the difference between the gate lengths L of the left and right transistors is small, if the value of the gate length itself largely deviates from the design value, it should be determined that an error has occurred. To perform a normal circuit operation, therefore, whether the gate length L of each transistor falls within the range of the upper and lower limits as shown in FIG. 9 is determined. The electrical filter database 35 shown in FIGS. 8 and 9 is used as the error determination criterion in step 17 of FIG. 1.

Third Example

The information concerning the electrical characteristics to be taken into consideration in the above embodiment will be explained below by using the third practical example. An object of this example is a resistance element made of a diffusion layer or polysilicon film.

The absolute values of resistance elements of many semiconductor integrated circuits are not set in design data. However, relative values between a plurality of resistance elements are required to have high accuracy.

Figure 10A:
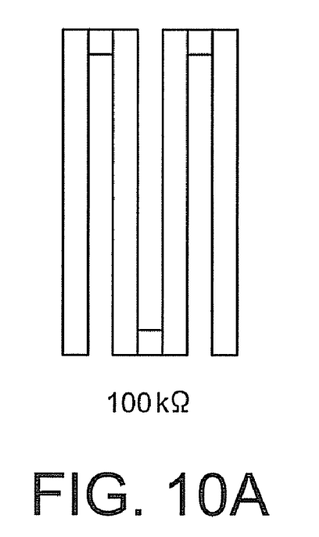
FIGS. 10A and 10B are views showing layout patterns of resistance elements as the third example taking account of the electrical characteristics in the embodiment.
Figure 10B:
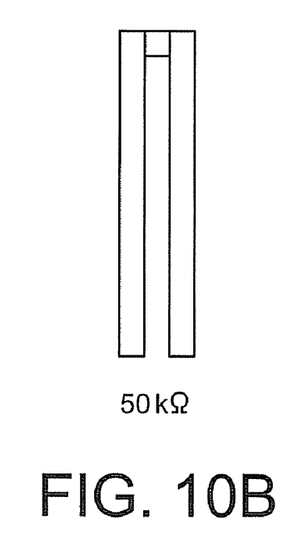

FIGS. 10A and 10B respectively illustrate the layout patterns of resistance elements formed by using an interconnection layer made of, e.g., polysilicon and having resistance values of 100 and 50 kΩ. The length of the resistance element having a resistance value of 100 kΩ is twice that of the resistance element having a resistance value of 50 kΩ.

Figure 11A:
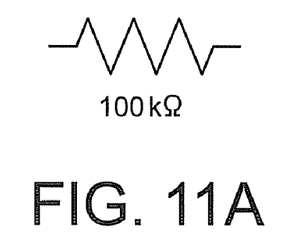
FIGS. 11A and 11B are views each showing the symbol of the resistance element in the third example.
Figure 11B:
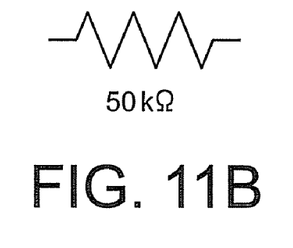

FIGS. 11A and 11B respectively illustrate the symbols of resistance elements having resistance values of 100 and 50 kΩ. Although the resistance values are different, identical symbols are used on the circuit diagram, so these resistance elements cannot be distinguished from each other.

Figure 12:
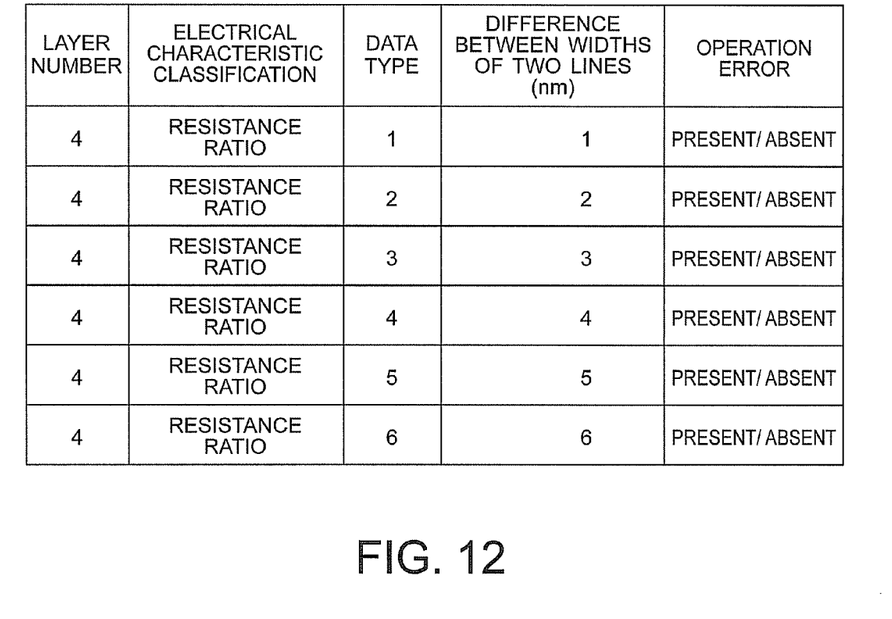
FIG. 12 is a view showing error determination reference values permissible when taking account of the electrical characteristics in the third example.

FIG. 12 shows permissible deviations, from a design value, of the resistance ratios of the two resistors having different resistance values. "4" is assigned as the layer number, the electrical characteristic is classified into a category "resistance ratio", and six data are set. For these six data, 1, 2, 3, 4, 5, and 6 (nm) are set as relative differences between the widths of two lines. The circuit simulation 33 is performed to determine whether an operation error occurs for each numerical value, and determine a numerical value to be used as a permissible value in error determination.

Figure 13:
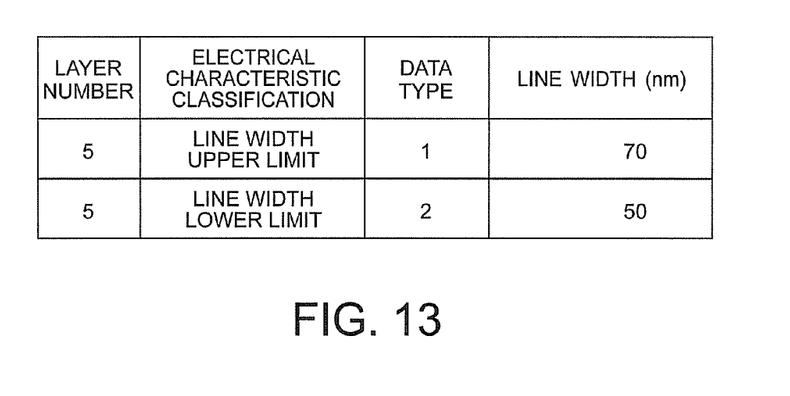
FIG. 13 is a view showing the upper limit and lower limit pertaining to a deviation from a design value when taking account of the electrical characteristics in the third example.

Even when the relative difference falls within the range of the permissible values shown in FIG. 12, it should be determined that an error has occurred if the absolute value of the line width largely deviates from the design value. As this error criterion, the upper and lower limits of the line width as shown in FIG. 13 are used. Referring to FIG. 13, two data are set. To perform a normal circuit operation, whether the width of each interconnection layer falls within the range of the upper and lower limits is determined. The electrical filter database 35 shown in FIGS. 12 and 13 is used as the error determination criterion in step 17 of FIG. 1.

Fourth Example

Figure 14:
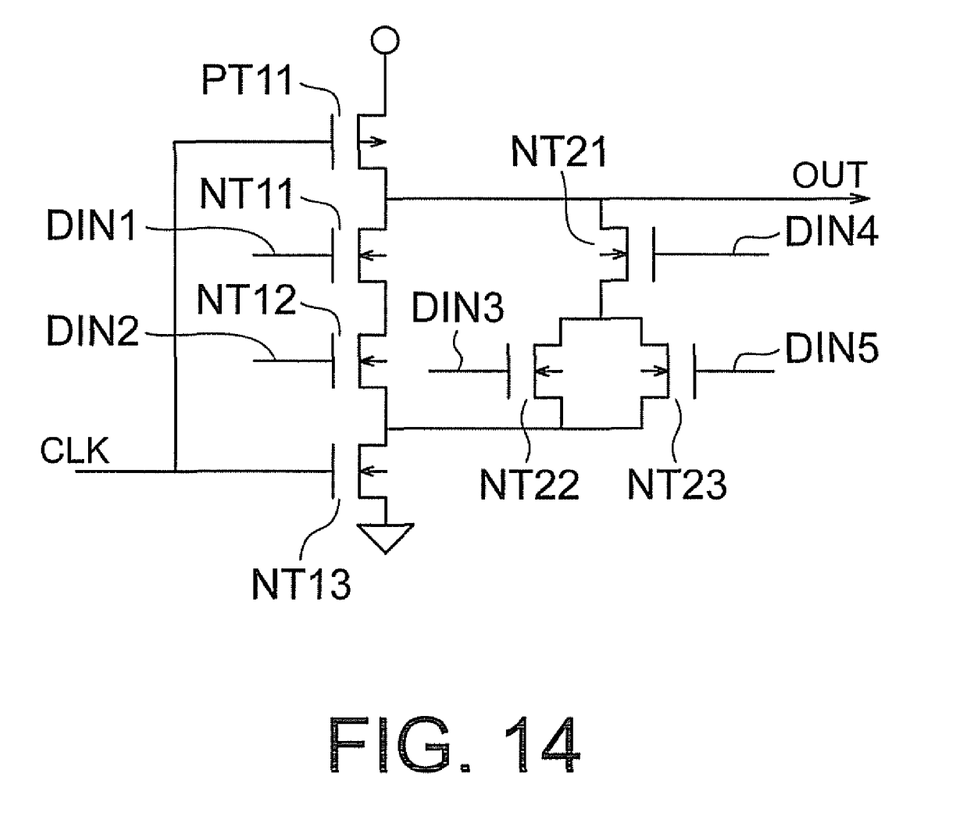
FIG. 14 is a view showing the layout pattern of a dynamic domino circuit having a foot device as the fourth example taking account of the electrical characteristics in the embodiment.

The information related to the electrical characteristics to be taken into account in the above embodiment will be explained below by using the fourth practical example. An object of this example is a dynamic domino circuit having a foot device as shown in FIG. 14.

In this circuit, the source and drain of a P-channel MOS transistor PT11 and the drains and sources of N-channel MOS transistors NT11, NT12, and NT13 are connected in series between a power supply voltage terminal and ground terminal. The gates of the P-channel MOS transistor PT11 and N-channel MOS transistor NT13 are connected together to an input terminal IN connected to a clock circuit, and receive a clock CLK. Input signals DIN1 and DIN2 output from a circuit in the preceding stage (not shown) are input to the gates of the N-channel MOS transistors NT11 and NT12.

In addition, the drains of the P-channel MOS transistor PT11 and N-channel MOS transistor NT11 are connected together to an output terminal OUT connected to a circuit in the succeeding stage (not shown) and corresponding to a dynamic node. The source and drain of an N-channel MOS transistor NT21 and the drains and sources of N-channel MOS transistors NT22 and NT23 connected in parallel are connected in series between the output terminal OUT and a node connected to the drains of the N-channel MOS transistors NT12 and NT13.

Input signals DIN3, DIN4, and DIN5 output from the circuit in the preceding stage (not shown) are respectively input to the gates of the N-channel MOS transistors NT21, NT22, and NT23.

In this dynamic domino circuit, the P-channel MOS transistor PT11 corresponds to a precharge device, and the N-channel MOS transistor NT13 corresponds to a foot device. A precharge operation and a state in which a signal corresponding to an input signal is output are switched in accordance with the clock CLK. In the output state, the level of the output terminal OUT dynamically changes in accordance with the input signals DIN1 to DIN5 supplied from the circuit in the preceding stage (not shown), and propagates like a domino phenomenon to the circuit in the succeeding stage (not shown).

When the clock CLK changes to Low level, the P-channel MOS transistor PT11 is turned on, and the N-channel MOS transistor NT13 of the foot device is turned off, thereby precharging the output terminal OUT to High level. After that, the clock CLK changes to High level to terminate the precharge operation, and the level of the output terminal OUT of the dynamic node goes High or Low in accordance with the levels of the input signals DIN1 to DIN5, and propagates to the circuit in the succeeding stage.

More specifically, the output terminal OUT is at Low level when both the N-channel MOS transistors NT11 and NT12 are ON. Alternatively, the output terminal OUT is at Low level when both the N-channel MOS transistors NT21 and NT22 are ON, or both the N-channel MOS transistors NT21 and NT23 are ON.

In this dynamic domino circuit, an electrical characteristic to be taken into consideration is a gate length L of the N-channel MOS transistor NT13 as a foot device. A leakage current increases if the gate length L on the pattern of the N-channel MOS transistor NT13 is smaller than a design value. Consequently, even when the N-channel MOS transistor NT13 is OFF, it cannot be completely turned off, and leakage occurs. This is undesirable from the viewpoint of characteristics in order to output signals corresponding to the input signals DIN1 to DIN5.

Figure 15:
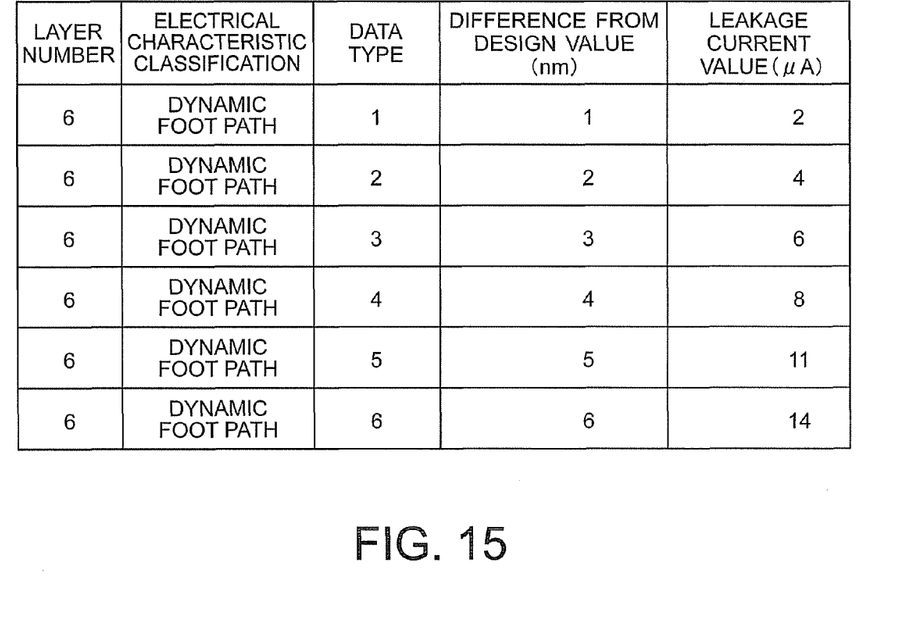
FIG. 15 is a view showing error determination reference values permissible when taking account of the electrical characteristics in the fourth example.

Accordingly, it is necessary to clarify a permissible value of the gate length L of the N-channel MOS transistor NT13 in the case where the gate length L is smaller than the design value, so as not to interfere with the circuit operation. FIG. 15 shows permissible deviations of the gate length L when it is smaller than the design value, as error determination criteria formed by performing the circuit simulation 33.

"6" is assigned as the layer number, the electrical characteristic is classified into a category "dynamic foot path", and six data are set. 1, 2, 3, 4, 5, and 6 (nm) are set as deviations from the design value when the gate length L is smaller than the design value. 2, 4, 6, 8, and 11 (µA) are obtained by calculations as leakage current values corresponding to these deviations. Values permissible from the viewpoint of the circuit specifications are clarified from these leakage current values, and permissible deviations of the gate length L from the design value are obtained. The electrical filter database 35 thus obtained is used as the error determination criterion in step 17 of FIG. 1.

Fifth Example

The information concerning the electrical characteristics to be taken into consideration in the above embodiment will be explained below by using the fifth practical example. An object of this example is a circuit in which two metal interconnections may shortcircuit.

Figure 16:
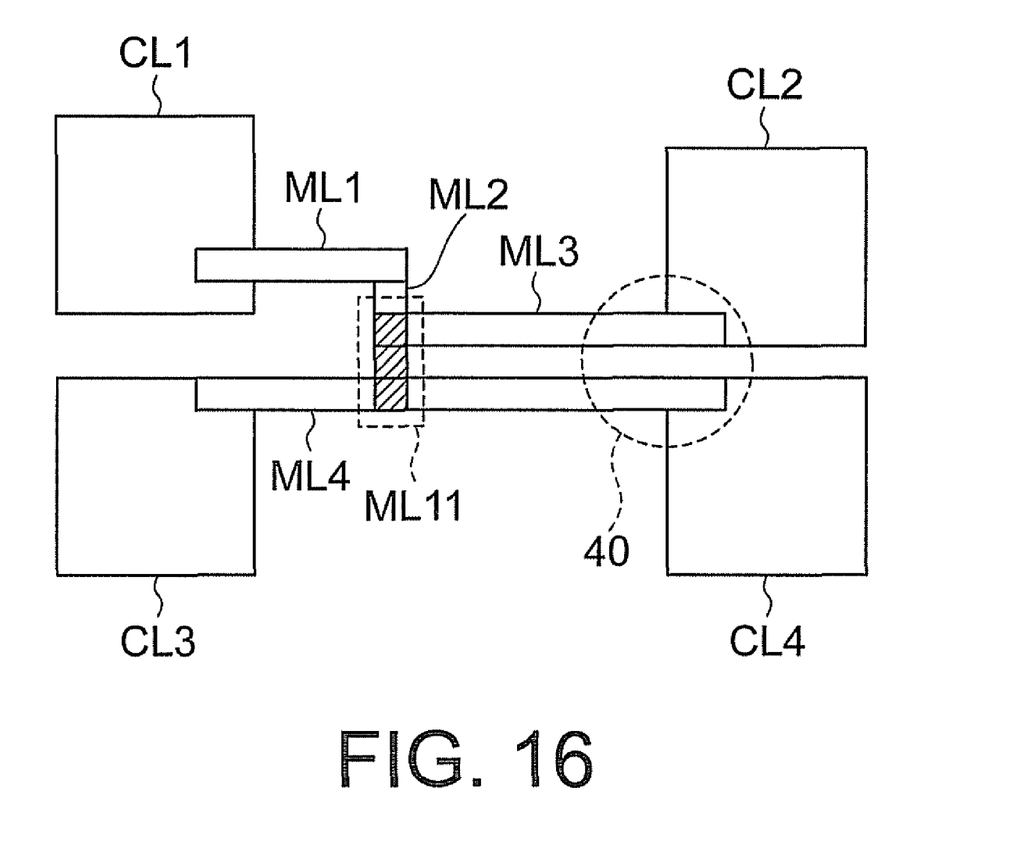
FIG. 16 is a view showing the layout pattern of a circuit having the possibility of a shortcircuit between two lines, as the fifth example taking account of the electrical characteristics in the embodiment.

As shown in FIG. 16, four cells CL1 to CL4 exist. The cells CL1 and CL2 are connected by metal interconnections ML1, ML2, and ML3 made of the same interconnection layer. The cells CL3 and CL4 are connected by a metal interconnection ML4. The metal interconnections ML2 and ML3 are connected to the metal interconnection ML4 by a metal interconnection ML11 made of a different interconnection layer.

Assume that in this state, an error is detected by the LRC, because there is the possibility of a shortcircuit between the metal interconnections ML3 and ML4 in a region 40 surrounded by the dotted line. The LRC for interconnections normally determines the presence/absence of an error in only an interconnection layer as an object of check. Even when checking a shortcircuit in the interconnection layers ML3 and ML4, therefore, information indicating that these layers are connected by the interconnection layer ML11 made of another layer is not used in the check. This makes it impossible to determine that no problem arises even if a shortcircuit occurs. As a consequence, data is fed back to design, and the TAT prolongs.

In the above embodiment, however, even in the fifth example as described above, the information indicating that no problem arises in the circuit operation even if a shortcircuit occurs because the two metal interconnections ML3 and ML4 are electrically at the same potential is used as an error filter, and the necessity of error correction is determined on the basis of the corrected criterion. This makes it possible to shorten the TAT.

The semiconductor integrated circuit designing method, the semiconductor integrated circuit designing apparatus, and the recording medium storing the semiconductor integrated circuit designing software according to the above embodiment can shorten the time required to determine an error in the LRC and correct a layout pattern.

The embodiment and the first to fifth examples described above are merely examples and do not limit the present invention. Accordingly, these embodiment and examples can be variously modified within the technical scope of the present invention.

The semiconductor integrated circuit designing method of the present invention may also be practiced by using software for allowing a computer having functions equivalent to those of the configuration shown in FIG. 2 to execute the processing of the above embodiment shown in FIG. 1.

What is claimed is:

1. A method of designing a semiconductor integrated circuit, comprising:
    generating, by an arithmetic unit, electrical filter graphic data indicating a candidate portion for which a dimensional value of a layout pattern is permitted to deviate from a design value by taking account of an electrical characteristic, and electrical filter data indicating a permissible dimensional value in the candidate portion of the layout pattern by taking account of the electrical characteristic, by using circuit diagram data, a static timing analytical result obtained by verifying a timing of a circuit operation, and a result of a circuit simulation, and storing the electrical filter graphic data and the electrical filter data in a storage unit;
    generating, by the arithmetic unit, design data by using the electrical filter graphic data, and forming the layout pattern by using the design data;
    detecting, by the arithmetic unit, a lithography error by performing a lithography simulation on the layout pattern;
    determining, by the arithmetic unit, using the electrical filter database, whether the lithography error requires correction by taking account of the electrical characteristic;
    correcting, by the arithmetic unit, the layout pattern in response to determining that the lithography error requires correction; and
    outputting, by an output unit, a result of the correcting.

2. The method according to claim 1,
    further comprising inputting the circuit diagram data and the static timing analytical result obtained by verifying the timing of the circuit operation through an input unit; and wherein
    the generating the electrical filter graphic data includes generating the electrical filter graphic data using the circuit data,
    the generating the electrical filter graphic data and the electrical filter data includes generating the electrical filter graphic data and the electrical filter data includes using the static timing analytical result, and
    the generating the electrical filter data includes generating the electrical filter data by performing a circuit simulation.

3. The method according to claim 1, wherein the generating the electrical filter graphic data and the electrical filter data includes generating the electrical filter graphic data and the electrical filter data by using the static timing analytical result, using an electrical filter database formation tool.

4. The method according to claim 2, wherein the generating the electrical filter graphic data and the electrical filter data includes generating the electrical filter graphic data and the electrical filter data by using the static timing analytical result, using an electrical filter database formation tool.

5. The method according to claim 1, wherein the static timing analytical result contains, as the electrical characteristic, control information concerning a critical value of a dimension of an element in a combinational circuit existing in a path having a margin for a timing at which a signal arrives at a predetermined portion on a circuit.

6. The method according to claim 2, wherein the static timing analytical result contains, as the electrical characteristic, control information concerning a critical value of a dimension of an element in a combinational circuit existing in a path having a margin for a timing at which a signal arrives at a predetermined portion on a circuit.

7. The method according to claim 1, wherein the circuit diagram data contains, as the electrical characteristic, at least one of first control information of a critical value in a first predetermined portion required to be symmetrical in the layout pattern, second control information of a pattern finished value in a second predetermined portion where a short circuit is permissible, or third control information of a gate length L of a transistor as a foot device of a dynamic domino circuit.

8. The method according to claim 2, wherein the circuit diagram data contains, as the electrical characteristic, at least one of first control information of a critical value in a first predetermined portion required to be symmetrical in the layout pattern, second control information of a pattern finished value in a second predetermined portion where a short circuit is permissible, or third control information of a gate length L of a transistor as a foot device of a dynamic domino circuit.

9. A semiconductor integrated circuit designing apparatus comprising:
    an arithmetic unit configured to:
        generate electrical filter graphic data indicating a candidate portion for which a dimensional value of a layout pattern is permitted to deviate from a design value by taking account of an electrical characteristic, and electrical filter data indicating a permissible dimensional value in the candidate portion of the layout pattern by taking account of the electrical characteristic, by using circuit diagram data, a static timing analytical result obtained by verifying a timing of a circuit operation, and a result of a circuit simulation,
        generate design data by using the electrical filter graphic data, and form the layout pattern by using the design data,
        detect a lithography error by performing a lithography simulation on the layout pattern,
        determine, by using the electrical filter database, whether the lithography error requires correction by taking account of the electrical characteristic, and
        perform a correction of the layout pattern in response to a determination that the lithography error requires correction;
    an output unit configured to output a result of the correction of the layout pattern; and
    a storage unit configured to store the electrical filter graphic data and the electrical filter database.

10. The apparatus according to claim 9, wherein
    the arithmetic unit is configured to:
    generate, by using the circuit diagram data, the electrical filter graphic data,
    generate, by using the static timing analytical result, the electrical filter graphic data and electrical filter data, and
    generate the electrical filter data by performing the circuit simulation.

11. The apparatus according to claim 9, wherein the arithmetic unit is configured to use an electrical filter database formation tool to facilitate generation of the electrical filter graphic data and the electrical filter data by using the static timing analytical result.

12. The apparatus according to claim 9, wherein the static timing analytical result contains, as the electrical characteristic, control information concerning a critical value of a dimension of an element in a combinational circuit existing in a path having a margin for a timing at which a signal arrives at a predetermined portion on a circuit.

13. The apparatus according to claim 10, wherein the static timing analytical result contains, as the electrical characteristic, control information concerning a critical value of a dimension of an element in a combinational circuit existing in a path having a margin for a timing at which a signal arrives at a predetermined portion on a circuit.

14. The apparatus according to claim 9, wherein the circuit diagram data contains, as the electrical characteristic, at least one of first control information of a critical value in a first predetermined portion required to be symmetrical in the layout pattern, second control information of a pattern finished value in a second predetermined portion where a short circuit is permissible, or third control information of a gate length L of a transistor as a foot device of a dynamic domino circuit.

15. The apparatus according to claim 10, wherein the circuit diagram data contains, as the electrical characteristic, at least one of first control information of a critical value in a first predetermined portion required to be symmetrical in the layout pattern, second control information of a pattern finished value in a second predetermined portion where a short circuit is permissible, or third control information of a gate length L of a transistor as a foot device of a dynamic domino circuit.

16. A non-transitory computer-readable medium having stored thereon computer-executable instructions that, in response to execution, cause a computer to perform operations including:
  generating, by an arithmetic unit, electrical filter graphic data indicating a candidate portion for which a dimensional value of a layout pattern is permitted to deviate from a design value by taking account of an electrical characteristic, and electrical filter data indicating a permissible dimensional value in the candidate portion of the layout pattern by taking account of the electrical characteristic, by using circuit diagram data and a static timing analytical result obtained by verifying a timing of a circuit operation;
  storing the electrical filter graphic data and the electrical filter data in a storage unit;
  generating, by the arithmetic unit, design data by using the electrical filter graphic data, and forming the layout pattern by using the design data;
  detecting, by the arithmetic unit, a lithography error by performing a lithography simulation on the layout pattern;
  determining, by the arithmetic unit by using the electrical filter database, whether the lithography error requires correction by taking account of the electrical characteristic;
  correcting, by the arithmetic unit, the layout pattern in response to determining that the lithography error requires correction; and
  outputting, by an output unit, a result of the correcting.

17. The computer-readable medium according to claim 16, wherein
  the generating the electrical filter graphic data includes generating the electrical filter graphic data using the circuit data,
  the generating the electrical filter graphic data and the electrical filter data includes generating the electrical filter graphic data and the electrical filter data using the static timing analytical result, and
  the generating the electrical filter data includes generating the electrical filter data by performing a circuit simulation.

18. The computer-readable medium according to claim 16, wherein the generating the electrical filter graphic data and the electrical filter data includes employing an electrical filter database formation tool.

19. The computer-readable medium according to claim 16, wherein the static timing analytical result contains, as the electrical characteristic, control information concerning a critical value of a dimension of an element in a combinational circuit existing in a path having a margin for a timing at which a signal arrives at a predetermined portion on a circuit.

20. The computer-readable medium according to claim 16, wherein the circuit diagram data contains, as the electrical characteristic, at least one of first control information of a critical value in a first predetermined portion required to be symmetrical in the layout pattern, second control information of a pattern finished value in a second predetermined portion where a short circuit is permissible, or third control information of a gate length L of a transistor as a foot device of a dynamic domino circuit.

* * * * *